(12) United States Patent
Campbell

(10) Patent No.: US 6,995,586 B2
(45) Date of Patent: Feb. 7, 2006

(54) MONOTONIC LEAKAGE-TOLERANT LOGIC CIRCUITS

(75) Inventor: Brian J. Campbell, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/820,255

(22) Filed: Apr. 8, 2004

(65) Prior Publication Data

US 2005/0225358 A1 Oct. 13, 2005

(51) Int. Cl.
*H03K 19/096* (2006.01)

(52) U.S. Cl. .......................... 326/95; 326/98; 326/93; 327/161; 327/379

(58) Field of Classification Search .................. 326/93, 326/95, 98; 327/208–212, 214, 215, 224, 327/225

See application file for complete search history.

(56) References Cited

U.S. PATENT DOCUMENTS

| | | | |
|---|---|---|---|
| 5,841,304 A * | 11/1998 | Tam ............................ | 327/161 |
| 5,880,608 A * | 3/1999 | Mehta et al. .................. | 326/93 |
| 6,046,621 A * | 4/2000 | Crowley ...................... | 327/333 |
| 6,201,431 B1 * | 3/2001 | Allen et al. .................. | 327/379 |
| 6,624,665 B2 * | 9/2003 | Kim et al. ..................... | 326/95 |
| 6,667,637 B1 * | 12/2003 | Mikan, Jr. .................... | 326/98 |
| 6,690,205 B2 * | 2/2004 | Alvandpour .................. | 326/98 |
| 6,833,735 B2 * | 12/2004 | Kumar et al. ................. | 326/95 |

* cited by examiner

Primary Examiner—Vibol Tan
(74) Attorney, Agent, or Firm—Garlick, Harrison & Markison LLP

(57) ABSTRACT

An improved logic methodology that combines the speed advantages of dynamic logic with the low contention of static logic, such that the logic circuits are not adversely affected by high-leakage transistors. The logic circuit of the present invention comprises first and second stages, wherein first logic stage comprises clocked precharge and evaluate transistors and full-complementary low-beta-ratio static logic. Subsequent stages of the logic circuit comprise full-complementary low-beta-ratio static logic, wherein the logic devices in the subsequent stages are not connected to a clock signal. The low-beta-ratio static logic devices in said subsequent stage comprise pMOS transistors that are not connected to a contention keeper. Furthermore, the low-beta-ratio static logic transistors in the subsequent stage comprise pMOS transistors that are significantly smaller than pMOS devices found in normal static logic. The logic circuit of the present invention provides lower clock loading than traditional dynamic logic circuits due to the tapering of the transistor stacks in the subsequent stages and because the subsequent stages do not require a clock signal. Furthermore, the logic circuit of the present invention requires less area in the integrated circuit due to the reduced size of the pMOS transistors used in place of traditional contention keepers. The logic circuit of the present invention has a very low skew because the precharge is distributed across multiple pMOS devices.

18 Claims, 3 Drawing Sheets

First Stage of Phase
301

Second Stage of Phase
301a

MONOTONIC LEAKAGE-TOLERANT LOGIC CIRCUITS

BACKGROUND OF THE INVENTION

1. Field of the Invention

The present invention relates in general to the field of logic circuits and, more specifically, to an improved logic methodology that combines the speed advantages of dynamic logic with the low contention of static logic, such that the circuits are not adversely affected by high leakage transistors. This is accomplished through the use of a circuit comprising leakage-tolerant dynamic and static logic.

2. Description of the Related Art

As semiconductor fabrication processes continue to advance, the leakage current (i.e., the residual current through a transistor when it is supposed to be "off") continues to increase at an exponential rate. This leakage current causes unwanted power dissipation as well as functional problems for dynamic logic.

In a dynamic logic circuit, there is a precharged node that must maintain its value near $V_{dd}$ during the evaluation phase in order for the circuit to work properly. This is usually done by adding a small pMOS transistor (keeper) whose drain is connected to the precharge node, source is connected to $V_{dd}$, and gate is connected to the circuit output (i.e., the precharge node through an inverting static gate).

With the very high leakage currents of modern process technologies, the keeper must be so large for most types of dynamic circuits that the speed of the dynamic circuit is adversely affected, thus eliminating one of the primary reasons for using dynamic circuits. The speed is hindered because the dynamic logic nMOS pull-down evaluation transistors must "fight" (or "contend with") the keeper in order to switch the gate logic value.

In view of the foregoing, there is a need for improved logic circuitry that has speed similar to dynamic logic, but with the leakage insensitivity of static logic.

SUMMARY OF THE INVENTION

The method and apparatus of the present invention overcomes the shortcomings of the prior art by providing an improved logic methodology that combines the speed advantages of dynamic logic with the low contention of static logic, such that the circuits are not adversely affected by high leakage transistors. In the present invention, this is accomplished through the use of a circuit comprising leakage-tolerant dynamic and static logic.

In one embodiment of the present invention, the first logic stage of a logic circuit comprises clocked precharge and evaluate transistors and full-complementary low-beta-ratio static logic. Subsequent stages of the logic comprise full-complementary low-beta-ratio static logic, wherein the logic devices in said subsequent stage are not connected to a clock signal. The low-beta-ratio static logic in said subsequent stage does not use a contention keeper. Furthermore, in the present invention, the low-beta-ratio static logic transistors in the subsequent stage comprise pMOS transistors that are significantly smaller than pMOS devices found in normal static logic.

The first stage of the logic circuit of the present invention comprises a tapered nMOS stack having a clocked nMOS transistor at the top of the stack and further comprises static pMOS pull-up transistors in place of a traditional contention keeper. Subsequent stages of the logic circuit of the present invention comprise tapered nMOS stacks without clock transistors and small pMOS pull-up devices. The pMOS devices have sizes that are based on predetermined criteria to maximize performance and minimize surface area. The minimum effective pMOS width is selected as the minimum width that will provide sufficient precharge for the gate. This effective width can be distributed across all of the pull-up pMOS transistors in the stage. Each pMOS transistor has a size that is only large enough to be effective for counteracting current leakage.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
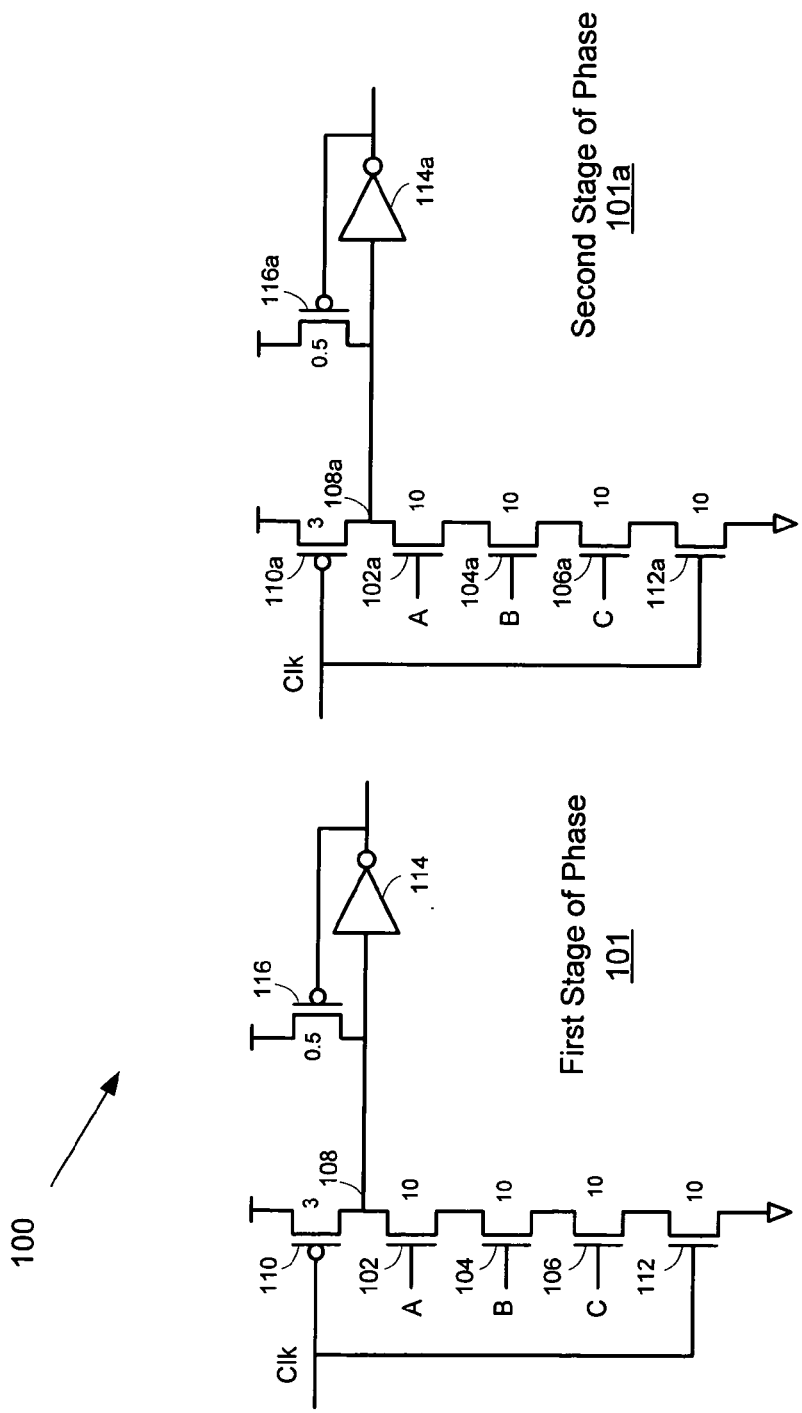
FIG. 1 is an illustration of the first and second phases of a conventional dynamic logic circuit.

FIG. 1 is an illustration of a conventional dynamic logic circuit 100 comprising a first stage 101 and second stage 101a. The dynamic logic circuit 100 comprises input nMOS transistors 102, 104, and 106 that receive logic input signals "A," "B," and "C," respectively. During the precharge phase, the clock signal CLK is LOW and, therefore, the nMOS transistor 112 is OFF and the pMOS transistor 110 is ON, thereby pulling node 108 HIGH. During the evaluation phase, the clock signal CLK is HIGH and, therefore, the pMOS transistor 110 is turned OFF and the nMOS transistor 112 is turned ON. During the evaluation phase, the nMOS transistors 102, 104, and 106 conditionally pull node 108 LOW, depending on the values of the input signals A, B, and C. A keeper comprising inverter 114 and pMOS transistor 116 maintains node 108 HIGH unless it is otherwise pulled LOW by the nMOS transistors 102, 104, and 106 during the evaluation phase. The output of the inverter 114 is provided to additional stages of the logic circuit, such as the second stage illustrated in FIG. 1. The components in the second stage of the phase illustrated in FIG. 1 are substantially identical to the corresponding components discussed in connection with the first stage and, therefore, their function will not be repeated.

The effect of the keeper in the prior art circuit 100 of FIG. 1 can be understood by referring again to the first stage 101. Since node 108 is initially HIGH, the output of the inverter 114 is initially LOW. The output of the inverter 114 will transition from LOW to HIGH during the evaluation phase only if the inputs A, B, and C are all HIGH. For the input signal condition where the output of the inverter 114 remains LOW (i.e., A, B, or C is LOW), there is no transition of the output signal and, therefore, the operational speed of the dynamic logic circuit is not adversely affected. For the input signal condition where the output of the inverter 114 transitions from LOW to HIGH, however, the ability of the inverter 114 to transition quickly and accurately can affect the operational speed of the dynamic logic circuit. In summary, there is a need to optimize the design of the logic stage for "pull-down" and to optimize the inverter 114 for "pull-up."

As was discussed hereinabove, the dynamic logic circuit 100 illustrated in FIG. 1 requires a relatively strong contention keeper because of the high leakage currents of transistors fabricated using current process technologies. A strong contention keeper, however, can adversely affect the speed of the circuit. Specifically, the speed of the dynamic logic circuit 100 is hindered because the nMOS pull-down evaluation transistors 102, 104, and 106 must "fight" the keeper in order to switch the gate logic value. The compromised speed seriously diminishes the value of the dynamic logic circuit 100 illustrated in FIG. 1 for many applications.

The widths of the various transistors used in the traditional dynamic logic circuit illustrated in FIG. 1 are denoted by the reference numerals adjacent to each transistor. For example, the input nMOS transistors 102, 104, 106 and the nMOS transistor 112 each have a width of 10 microns. The pMOS transistor 110 illustrated in FIG. 1 has a width of 3 microns, while the pMOS device 116 used in the keeper has a width of 0.5 microns. The dimensions of the corresponding circuit components in the second stage of the phase have the same dimensions as those discussed in connection with the first phase of the dynamic logic circuit 100. Similar reference numerals will be used to denote the size of transistors of the dynamic logic circuits illustrated in FIGS. 2 and 3. The size of the various circuit components will be discussed for purposes of illustrating the operating characteristics and advantages of the present invention. As will be understood by those of skill in the art, however, other dimensions can be used for the various circuit components, depending on the specific fabrication process, without departing from the teachings of the present invention.

Figure 2:
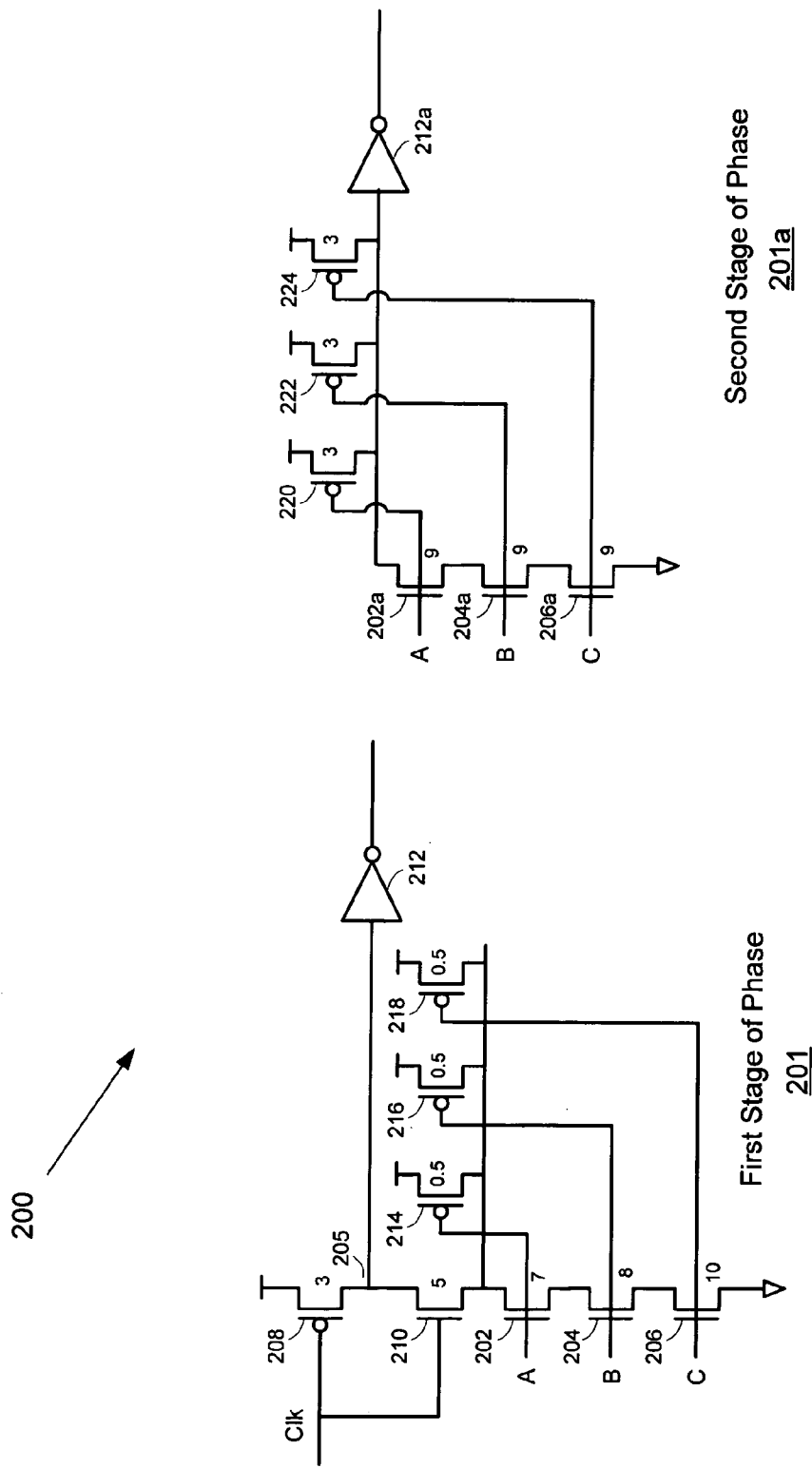
FIG. 2 is an illustration of the first and second phases of a conventional logic circuit having a tapered transistor stack in the first stage.

FIG. 2 is an illustration of another prior art logic circuit 200 comprising a first stage 202 having a tapered stack of input transistors and a second stage 201a wherein the stack of input transistors is not tapered. As can be seen in FIG. 2, data inputs A, B, and C for the first stage are received by nMOS transistors 202, 204, and 206, respectively. The clock signal CLK for the first stage is provided as an input to the gates of pMOS transistor 208 and nMOS transistor 210. When the clock signal CLK is LOW, the nMOS transistor 210 will be turned OFF and the pMOS transistor 208 will be turned ON, thereby maintaining node 205 HIGH at a voltage approximately equal to $V_{dd}$. During the evaluate phase, the clock signal CLK will go HIGH, thereby turning pMOS transistor 208 OFF and turning nMOS transistor 210 ON.

As can be seen in FIG. 2, the gates of the respective input nMOS transistors in the first stage 201 are tied to the gates of the corresponding pMOS pull-up transistors. For example, the gate of nMOS transistor 202 is tied to the gate of pMOS transistor 214. Likewise, the gate of input transistors 204 and 206 are tied to the gates of pMOS pull-up transistors 216 and 218, respectively.

The second stage 201a of the prior art logic circuit 200 illustrated in FIG. 2 comprises a static logic circuit that does not receive a clock signal input. The gates of the respective input nMOS transistors in the second stage 201a are tied to the gates of the corresponding pMOS pull-up transistors. For example, the gate of nMOS transistor 202a is tied to the gate of pMOS transistor 220. Likewise, the gates of input transistors 204a and 206a are tied to the gates of pMOS pull-up transistors 222 and 224, respectively.

The stack of nMOS transistors in the first stage of the logic circuit 200 are "tapered" to improve performance by compensating for the performance effects related to the capacitances created by various nMOS transistors in the stack. For example, the nMOS transistors 210, 202, 204, and 206 have widths of 5 microns, 7 microns, 8 microns, and 10 microns, respectively. The stack of nMOS transistors in the second stage of the circuit 200, however, is not tapered. Each of the nMOS transistors 202a, 204a, and 206a have widths of 9 microns. Furthermore, each of the pMOS pull-up transistors 220, 222, and 224 have widths of 3 microns.

Figure 3:
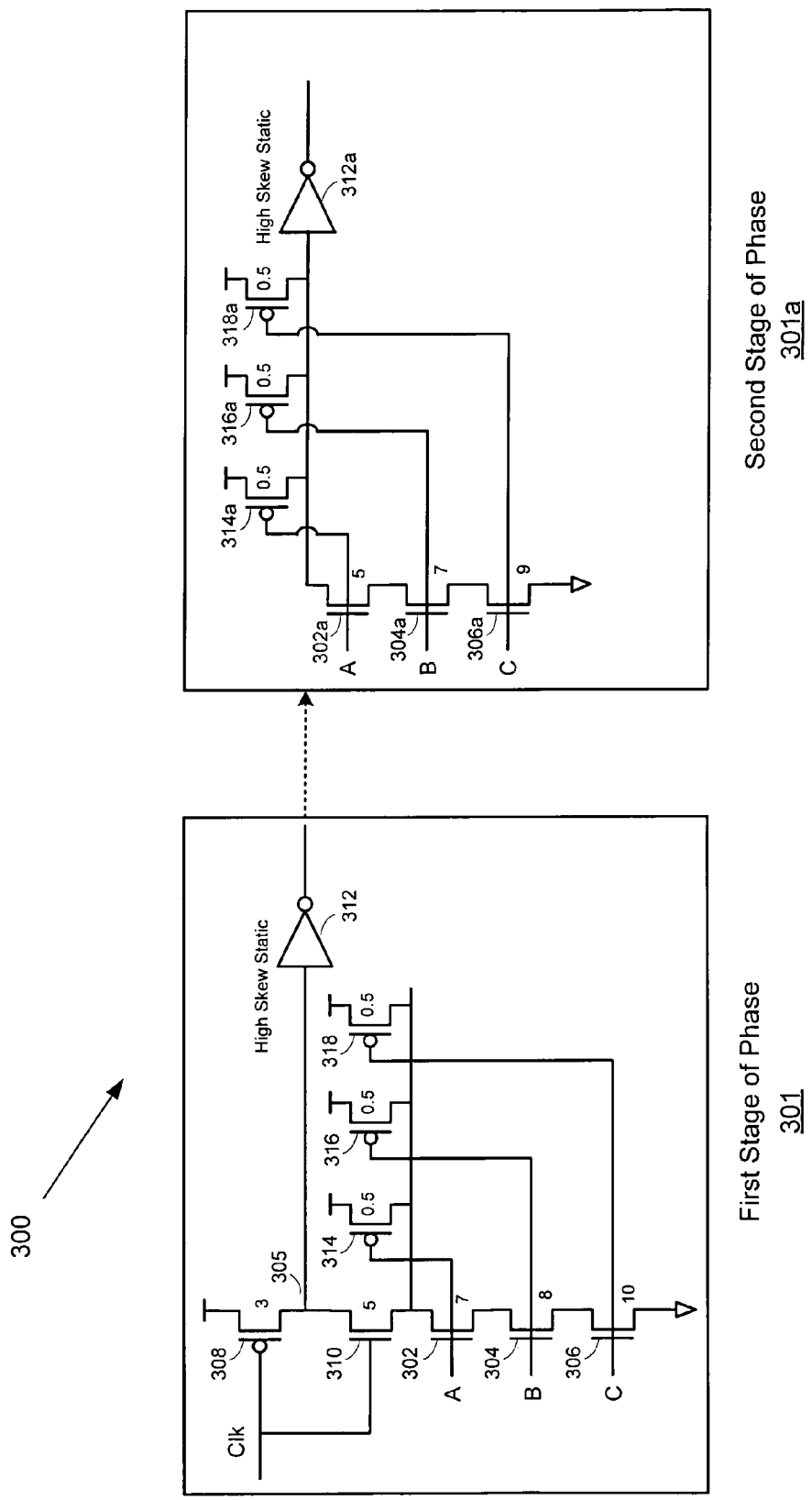
FIG. 3 is an illustration of the first and second phases of the monotonic leakage-tolerant logic circuit of the present invention.

FIG. 3 is an illustration of the monotonic leak-tolerant circuit 300 of the present invention comprising both leakage-tolerant clocked logic and static logic. In the embodiment illustrated in FIG. 3, the present invention comprises a first stage of logic that has both clocked precharge and evaluate transistors as well as full-complementary low-beta-ratio static logic. In the improved logic circuit 300 of the present invention, both the first and second stages of the circuit comprise tapered stacks of nMOS input transistors. In addition, the subsequent stage of logic illustrated in FIG. 3 comprises full-complementary low-beta-ratio static logic. However, the subsequent stage does not comprise clock inputs.

The use of low-beta-ratio static logic in the second stage of the logic circuit 300 is a significant aspect of the present invention. In the context of the present invention, "low-beta-ratio" logic comprises pMOS transistors that are significantly smaller than would be used in conventional static logic. This saves surface area on the integrated circuit and also improves the speed of the circuit pull-down by reducing the cross-over contention between the nMOS and pMOS transistors during the transition.

As can be seen in FIG. 3, data inputs A, B, and C for the first stage are received by nMOS transistors 302, 304, and 306, respectively. The clock input for the first stage is provided as an input to the gates of pMOS transistor 308 and nMOS transistor 310. When the clock is LOW, pMOS transistor 308 will be turned ON, thereby maintaining node 305 HIGH at a voltage approximately equal to $V_{dd}$. During the evaluate phase, the clock signal CLK will go HIGH, thereby turning nMOS transistor 310 ON.

The first stage of the logic circuit illustrated in FIG. 3 comprises a tapered nMOS stack of transistors 302, 304, and 306 with a clocked nMOS transistor 310 at the top of the stack. As discussed above in connection with the prior art tapered logic circuit 200, the first stage of the phase further comprises static pMOS pull-up transistors rather than a contention keeper. In the logic circuit 300 of the present invention, however, subsequent stages of the phase also comprise a tapered stack of nMOS input transistors but without a clocked transistor in the stack.

As can be seen in FIG. 3, the gates of the respective nMOS input transistors in the first stage 301 are tied to the gates of the corresponding pMOS pull-up transistors. For example, the gate of nMOS transistor 302 is tied to the gate of pMOS transistor 314. Likewise, the gate of input transistors 304 and 306 are tied to the gates of pMOS pull-up transistors 316 and 318, respectively.

The second stage 301a of the phase of the logic circuit 300 comprises a static logic circuit that does not receive a clock signal input. The gates of the respective input nMOS transistors are tied to the gates of the corresponding pMOS pull-up transistors. For example, the gate of nMOS transistor 302a is tied to the gate of pMOS transistor 320. Likewise, the gate of input transistors 304a and 306a are tied to the gates of pMOS pull-up transistors 322 and 324, respectively.

The stack of nMOS transistors in both the first stage and the second stage of the logic circuit 300 are "tapered" to improve performance by compensating for the performance effects related to the capacitances created by various nMOS transistors in the stack. For example, the nMOS transistors 210, 202, 204, and 206 have widths of 5 microns, 7 microns, 8 microns, and 10 microns, respectively, as discussed above in connection with the prior art logic circuit 200. The stack of nMOS transistors in the second stage of the improved logic circuit 300, however, is also tapered. The nMOS input transistors 302a, 304a and 306a have widths of 5 microns, 7 microns and 9 microns, respectively.

The small pMOS pull-up transistors are sized based on design criteria that ensure efficient performance and acceptable leakage tolerance. Each of the pMOS pull-up transistors 314a, 316a, and 318a have widths of 0.5 microns, although those of skill in the art will recognize that other widths for these transistors can be implemented without departing from the teachings of the present invention. As will be understood by those of skill in the art, the ratio of dimensions of the pMOS transistors and the respective nMOS transistors in the tapered stack resulting in a beta-ratio that is substantially less than 1:1. The minimum effective pMOS width only needs to be enough to "precharge" the gate. This effective width can be distributed across all the pMOS transistors 314a, 316a, and 318a. Furthermore, the minimum size for each PMOS transistor needs to only be enough to combat leakage.

The present invention offers numerous advantages over prior art logic circuits and is able to overcome the functional problems associated with transistors fabricated using current process technologies. The logic circuit of the present invention combats current leakage without the use of contention keepers, thereby offering improved performance in terms of speed. In addition, the logic circuit of the present invention provides lower clock loading than traditional dynamic logic circuits due to the tapering of the transistor stacks in the subsequent stages and because the subsequent stages do not require a clock signal. Furthermore, the logic circuit of the present invention requires less area in the integrated circuit due to the reduced size of the pMOS transistors used in place of traditional contention keepers. Finally, the logic circuit of the present invention has a very low skew because the precharge is distributed across multiple pMOS devices.

OTHER EMBODIMENTS

Other embodiments are within the following claims. The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A logic circuit, comprising:
a first logic stage comprising first logic circuitry operable to receive a first set of input signals and to generate a first output signal in response thereto, wherein said first logic circuitry comprises clocked precharge and evaluate transistors and further comprises full-complementary low-beta-ratio static logic; and
at least one subsequent logic stage, comprising second logic circuitry operable to receive a second set of input signals and to generate a second output signal in response thereto, wherein said second logic circuitry comprises non-clocked, low-beta-ratio static logic.

2. The logic circuit of claim 1, wherein said first logic circuitry comprises a plurality of input transistors configured in a first tapered stack.

3. The logic circuit of claim 2, wherein said clocked precharge circuitry comprises at least one pMOS transistor operable to hold a first node at a voltage, Vdd, during a precharge phase.

4. The logic circuit of claim 3, wherein said tapered stack of input transistors comprises a plurality of nMOS transistors operable to conditionally pull said first node to a lower voltage during an evaluation phase in response to a predetermined set of input signals.

5. The logic circuit of claim 4, wherein said subsequent logic stage comprises a plurality of input transistors configured in a second tapered stack connected to a second node that is maintained at a voltage, Vdd, during a precharge phase and wherein said input transistors are operable to conditionally pull said node to a lower voltage during an evaluation phase in response to a predetermined set of input signals.

6. The logic circuit of claim 5, wherein said low-beta-ratio static logic in said second logic circuitry comprises a plurality of pMOS transistors operably connected to said second node and wherein said plurality of pMOS transistors are operable to hold said second node at a voltage, Vdd, during said precharge phase.

7. The logic circuit of claim 6, wherein said second tapered stack of input transistors comprises a plurality of nMOS transistors with each individual nMOS transistor in said second stack has its gate connected to the gate of one of said plurality of pMOS transistors.

8. The logic circuit of claim 7, wherein the beta-ratio of said non-clocked static logic in said second logic circuitry is less than 1:1.

9. The logic circuit of claim 8, wherein the precharge load for maintaining said second node at Vdd is distributed across said plurality of pMOS transistors connected to said second node.

10. A method of operating a logic circuit, comprising:
receiving a first set of input signals in a first logic circuit and generating a first output signal in response thereto,
receiving a second set of input signals in a second logic circuit and generating a second output signal in response thereto,
wherein said first logic circuitry comprises clocked precharge and evaluate transistors and further comprises full-complementary low-beta-ratio static logic; and
wherein said second logic circuitry comprises non-clocked, low-beta-ratio static logic.

11. The method of claim 10, wherein said first logic circuitry comprises a plurality of input transistors configured in a first tapered stack.

12. The method of claim 11, wherein said clocked precharge circuitry comprises at least one pMOS transistor operable to hold a first node at a voltage, Vdd, during a precharge phase.

13. The method of claim 12, wherein said tapered stack of input transistors comprises a plurality of nMOS transistors operable to conditionally pull said first node to a lower voltage during an evaluation phase in response to a predetermined set of input signals.

14. The method of claim 13, wherein said subsequent logic stage comprises a plurality of input transistors configured in a second tapered stack and wherein said second tapered stack of input transistors is connected to a second node that is maintained at a voltage, Vdd, during a precharge phase and wherein said input transistors are operable to conditionally pull said node to a lower voltage during an evaluation phase in response to a predetermined set of input signals.

15. The method of claim 14, wherein said low-beta-ratio static logic in said second logic circuitry comprises a plurality of pMOS transistors connected to said second node and wherein said plurality of pMOS transistors are operable to hold said second node at a voltage, Vdd, during said precharge phase.

16. The method of claim 15, wherein said second tapered stack of input transistors comprises a plurality of nMOS transistors with each individual nMOS transistor in said second stack has its gate connected to the gate of one of said plurality of pMOS transistors.

17. The method of claim 16, wherein the beta-ratio of said non-clocked static logic in said second logic circuitry is less than 1:1.

18. The method of claim 17, wherein the input transistors in said second tapered stack in said second logic circuitry, wherein said clocked precharge circuitry comprises at least one pMOS transistor operable to hold a first node at a voltage, Vdd, during an evaluation phase.

* * * * *